United States Patent [19]

Pedder

[11] Patent Number: 5,786,701
[45] Date of Patent: Jul. 28, 1998

[54] BARE DIE TESTING

[75] Inventor: David John Pedder, Long Compton, United Kingdom

[73] Assignee: Mitel Semiconductor Limited, Wiltshire, United Kingdom

[21] Appl. No.: 625,547

[22] Filed: Apr. 1, 1996

Related U.S. Application Data

[63] Continuation-in-part of Ser. No. 261,395, Jun. 17, 1994, abandoned.

[30] Foreign Application Priority Data

Jul. 2, 1993 [GB] United Kingdom ............ 9313721

[51] Int. Cl.[6] .................................................. G01R 31/02
[52] U.S. Cl. ................................................................ 324/754
[58] Field of Search ................................ 324/754, 757, 324/758, 761, 765; 29/833

[56] References Cited

U.S. PATENT DOCUMENTS

| | | | |
|---|---|---|---|
| 4,912,399 | 3/1990 | Greub et al. | 324/754 |
| 5,317,255 | 5/1994 | Suyama et al. | 324/754 |
| 5,374,893 | 12/1994 | Koopman et al. | 324/754 |
| 5,576,630 | 11/1996 | Fujita | 324/760 |

*Primary Examiner*—Ernest F. Karlsen
*Assistant Examiner*—Russell M. Kobert
*Attorney, Agent, or Firm*—Kirschstein, et al.

[57] ABSTRACT

A testing apparatus for testing integrated circuits at the bare die stage includes a testing station at which microbumps of conductive material are located on interconnection trace terminations of a multilayer interconnection structure, these terminations being distributed in a pattern corresponding to the pattern of contact pads on the die to be tested. To facilitate testing of the die before separation from a wafer using the microbumps, the other connections provided to and from the interconnection structure have a low profile.

9 Claims, 5 Drawing Sheets

BARE DIE TESTING

The present application is a continuation in part of Application No. 08/261,395, filed Jun. 17, 1994 now abandoned.

BACKGROUND OF THE INVENTION

FIELD OF THE INVENTION

Silicon integrated circuit devices (SICs) are processed in wafer form and initial device testing is conducted on the completed wafer prior to dicing, using a probe card or, more recently, a membrane probe card, to make electrical contacts to the contact pads of the ICs under test. A conventional probe card comprises a radial array of metallic probes supported in a circular aperture on a printed circuit board. The probes are provided with fine probe tips, commonly fabricated using fine tungsten wire which has been formed to a spherical tip shape at the point of contact, with a typical tip diameter of 50 micrometres. The probe tips are typically 0.5 mm in length and 0.15 mm diameter. Contact forces of 6 to 8 grams per probe are employed to ensure that low contact resistance to the aluminum alloy metallization pads on the IC is obtained. A probe set is expected to provide some 0.5 million touch downs before replacement. The probes are independently mounted and adjusted to ensure consistent contact. Tungsten is selected as the probe material since it provides high hardness for a low probe wear rate and low electrical resistivity for low probe resistance.

Device tests on wafer include basic parametric tests, low frequency functional testing and, in some cases, speed bining tests using specially designed test structures, or boundary scan testing. The relatively high resistance and particularly the inductance of the conventional probe card arrangement, however, precludes thorough device testing at full operating frequency. A further constraint on wafer level testing is associated with the finite test time required to conduct a comprehensive functional test, particularly when this testing is conducted at less than functional speed. The mechanical difficulties associated with constructing conventional probe cards for very high pin count ICs is one reason that alternative probe card approaches are now being examined.

Once the ICs that have passed the wafer level probe testing have been packaged, then comprehensive functional testing can proceed. The package provides mechanical protection for the IC, to allow straightforward device handling in the test system feeder, and also a practical means of making contact to the device under test through the package leads. Packaged devices may be fully functionally tested at speed in generally acceptable test times.

A more recent advance in wafer level IC testing has been the introduction of the membrane probe card structure. Here a multilayer, flexible pcb interconnection structure is employed that can provide controlled impedance, fine pitch traces to the location of the pads of the device under test. Contacts to the device under test are made through plated gold bumps provided on the pcb trace terminations, with the application of a suitable contact force and wipe action. The multilayer pcb structure provides a ground plane local to the signal traces to allow controlled impedance interconnections to be realised from the test equipment electronics through to the device under test. The membrane probe card does allow higher frequency wafer level testing and is also far better suited to the testing of high pin count devices. Temperature testing with the membrane probe card approach is limited by the membrane materials of construction to about 85°C.

A microbumped test head which forms the subject of co-pending U.K. Patent Application No. 9202560.0 is illustrated in the cross-sectional diagram of FIG. 1. Here the device to be tested is held on the vacuum chuck of a flip chip apparatus with the active device surface facing the test head substrate. This flip chip apparatus is very similar in construction to a flip chip bonding equipment since it provides a means of picking up the bare die, of aligning it with respect to the microbumps on the test head, of bringing the device into contact with the test head and of applying the required contact force. After the test good die are transferred to an appropriate waffle pack container, while failed die are rejected.

The apparatus may differ from a conventional flip chip bonding apparatus only in its being used to provide a temporary contact between the device and the test substrate rather than being a means to a permanent connection. Flip chip bonding equipments allow heating of die and/or substrate and this capability may also be of use in the present application to allow bare die testing at elevated temperature. The flip chip apparatus uses an optical alignment method, for example an optical prism or semi-silvered mirror arrangement that allows simultaneous viewing of the die and substrate through solid state CCD camera or microscope optics, to accurately align the bond pads of the device over the microbumps on the substrate. In the case of the solid state CCD camera system, an optical probe is inserted between the die and the substrate, which are separated in space, for the alignment step. After alignment, the optical probe is removed, the device is brought down onto the microbump contact points and an appropriate contact pressure and wipe action applied to ensure low contact resistance (the stepper motor control on such equipments allow wipe amplitudes of a few micrometres to be employed for reliable contact but minimal pad damage). Such equipments also allow accurate autocollimation of the die and substrate surfaces to ensure parallelism and even application of the applied force over the microbumps contacts. Flip chip bonding equipments are now becoming available that may be used in the proposed bare die test mode with die handling rates of many hundred die per hour.

The test head provides high interconnection density, high bandwidth interconnections from the device under test, via the microbump contact points, to the test equipment circuitry. The substrate is constructed by thin film technologies, for example with a multilayer aluminum-polyimide metallization structure, with typically three or four layers 21 of interconnects and a ground plane 22 or, a power plane and one or two layers for signal trace routing. The track geometries on the silicon substrate are between 10 and 25 micrometer line widths, with metal thicknesses of 2 to 5 micrometres at track pitches of 40 to 100 micrometres, while dielectric thicknesses are in the 5 to 20 micrometer range. Such geometries allow controlled impedance, 50 ohm lines to be defined if required, and passive thin film electrical components such as capacitors, inductors, transformers and resistors may be integrated into the test head chip for coupling matching or termination purposes. Alternative materials include copper as the conductor material and a range of alternative polymers, including BCB and PPQ. This interconnection technology geometry allows test access traces to be easily routed into the device under test area, while the low parasitics of the interconnection traces and the well defined trace impedances provide high bandwidth. The power and ground plane structures provide high performance power and ground connections at the site of the device under test.

SUMMARY OF THE INVENTION

According to the present invention in a bare die testing apparatus comprising a multilayer interconnection structure providing a testing station for bare die, said testing station having a plurality of microbumps of conductive material located on interconnection terminations of said structure and distributed in a pattern corresponding to the pattern of contact pads on a bare die to he tested, low-profile connections are provided to and from said structure to permit testing of a die before separation from a wafer.

The interconnection structure may be provided with one or more apertures whereby a part or fully populated multichip module may be tested. There may be provided means releasably to secure said interconnection structure in position in said testing apparatus.

BRIEF DESCRIPTION IF THE DRAWINGS

A bare die testing apparatus in accordance with the present invention will now be described by way of example with reference to the accompanying drawings, of which:

DETAILED DESCRIPTION OF THE PREFERRED EMBODIMENTS

Figure 1:
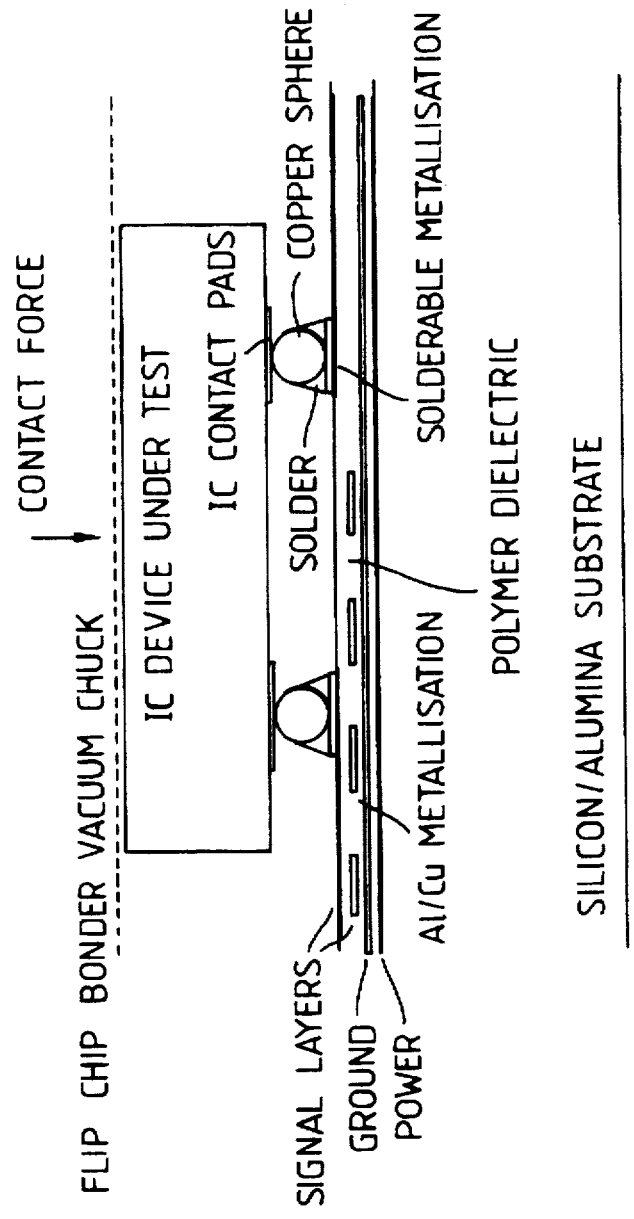
FIG. 1 shows diagrammatically part of a known test head arrangement.
Figure 2:
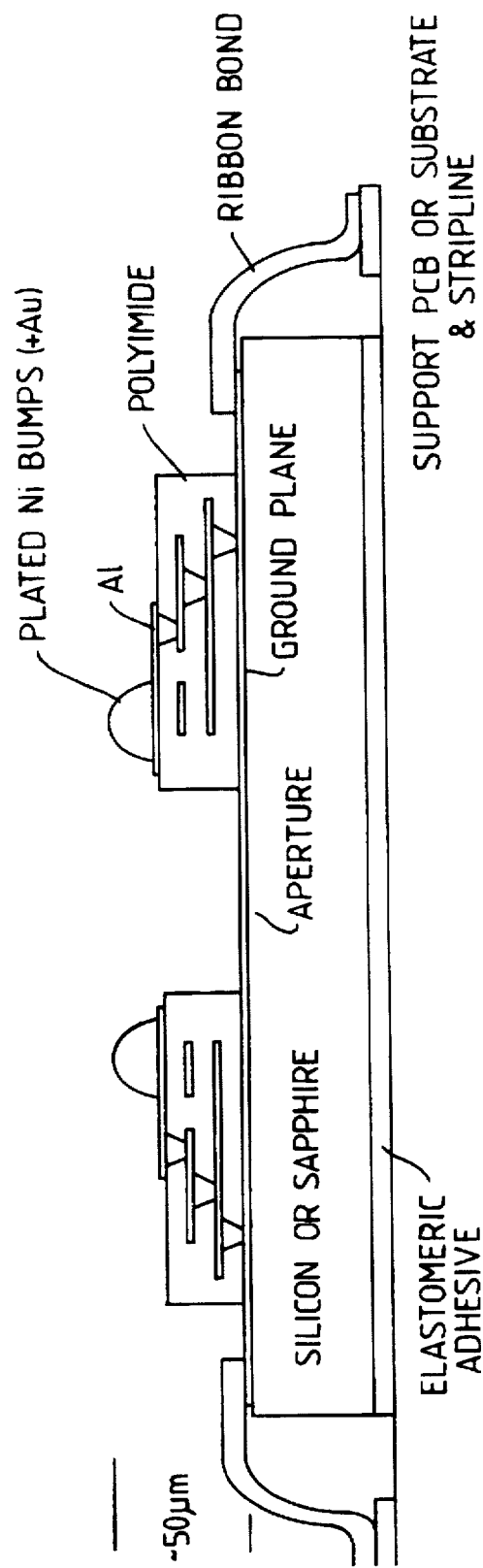
FIGS. 2 to 6 show diagrammatically parts of different multilayer interconnection structures for a testing apparatus in accordance with the invention.
Figure 4:
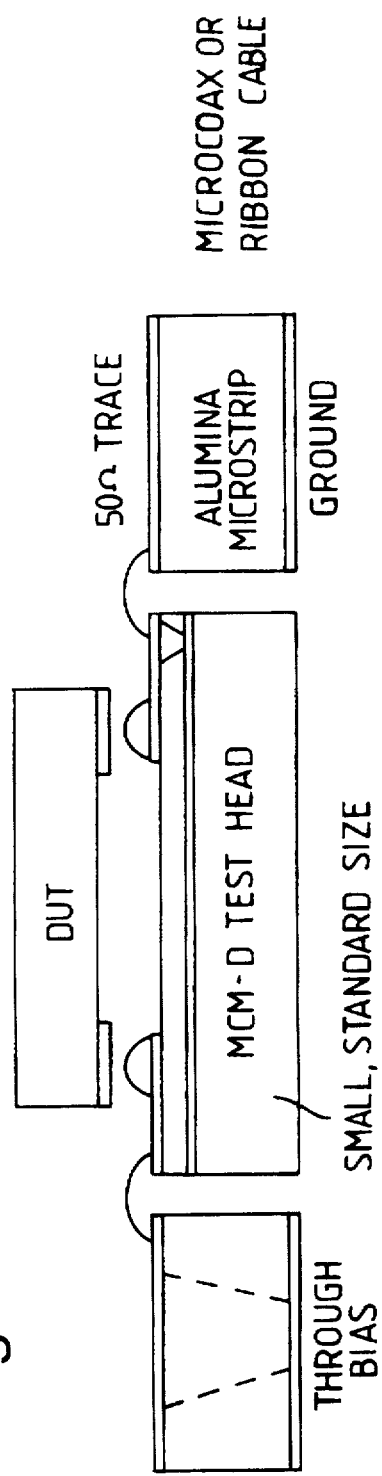
Figure 5:
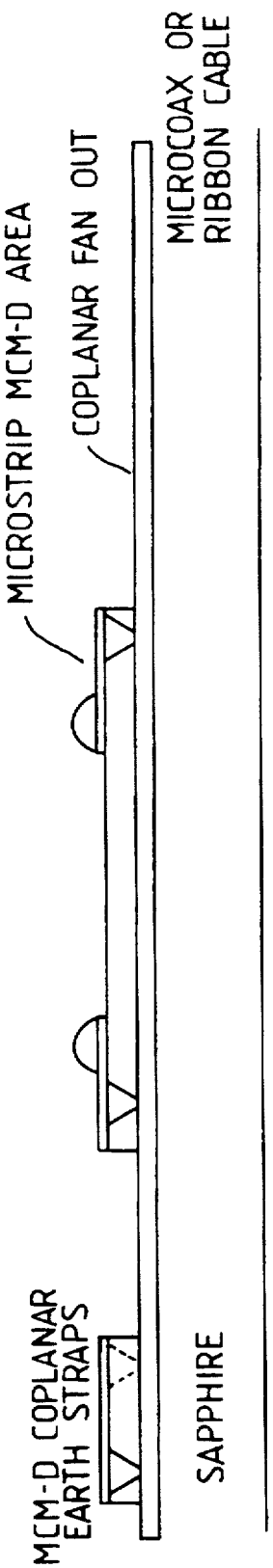

Referring to FIGS. 2, 4 and 5, the key feature is the provision of connections 1 from the test head to the surrounding test circuitry that do not mechanically interfere with the lowering and presenting of the microbump contacts 2 to the wafer 3 under test. Such a constraint clearly does not arise in the testing of individual devices. The ability to wafer level test is achieved by the use of bond pad connections 4 on the substrate periphery 5 at the level of the substrate 6 itself and the use of low profile ribbon bonding to make the connections between these bond pads 4 and the supporting circuit board 7. The typical total thickness of the multilayer metal and dielectric of the substrate 8 is 20 micrometres, while the nickel microbump 2 may be some 30 micrometers in height. A 10 to 15 micrometer thick, low profile ribbon bond 1 may then be made that does not rise above the allowable 50 micrometer limit. The substrate base 6 may be of silicon or sapphire or other transparent and insulating material. Sapphire, for example, can provide transparency for alignment of the microbumps 2 to the pads of the devices on the wafer 3 under test, and being insulating, provides no risk of edge shorting at the ribbon bond connections 1. An aperture 9 for alignment may be provided as required in the central region of the multilayer metal and dielectric structure 8 of the test head if a transparent substrate 6 is employed. The use of such an apparatus then allows full functional, at temperature testing to be conducted on wafers 3 that may be diced for multichip module use or shipped in whole wafer form for conventional packaging. The resulting packaging of devices that have been fully functionally tested before packaging means that packaging costs will only be incurred for good die. The inability to fully test devices at the wafer level has, to date, meant that a proportion of devices packaged after probe testing were in fact not functional, thus incurring unnecessary additional costs.

A small, standardized test head substrate size may be employed for minimal cost. A size of about 12 mm is envisaged for the testing of GaAs MMICs or small bipolar or CMOS digital ICs. A 20 mm substrate size is envisaged for testing of the larger CMOS digital ICs. Where very high frequency connections are required to the rest of the test equipment, such test heads would be connected by wire bonding (or ribbon bonding for lower inductance) to alumina microstrip substrates 10 that provided surface microstrip or coplanar feed traces to suitable microcoax or ribbon cable external connections. Multiple ground connections would be made from the test head substrate for good ground behavior, while through via connections 11 for good grounding, with low resistance metallization and appropriate fan out geometry would be employed on the alumina microstrip to ensure minimal losses between test head and test instrumentation.

If low cost is less of an objective, and maximum signal fidelity is essential, then larger test head substrates 6 may be employed, using sapphire or other good microwave dielectric material as the base for the test head interconnection structure. The central area of the test head would adopt a microstrip format for the polyimide-multilayer metallization structure 8, with the microbumps 2 and signal traces located on the upper metal layer pads as required. In the region beyond the microbumps 2, the traces would make a transition, using appropriate vias 11, to a coplanar format, with the signal traces now located on the sapphire surface itself with inter-signal ground traces. Such transitions should show far less signal distortion that would be associated with the inductive discontinuity of a wire or ribbon bond 1. Multiple earth straps would be provided between the earth traces using polyimide-multilayer metallization cross overs. This larger substrate would terminate in microcoax or ribbon cable connectors as before.

Figure 3:
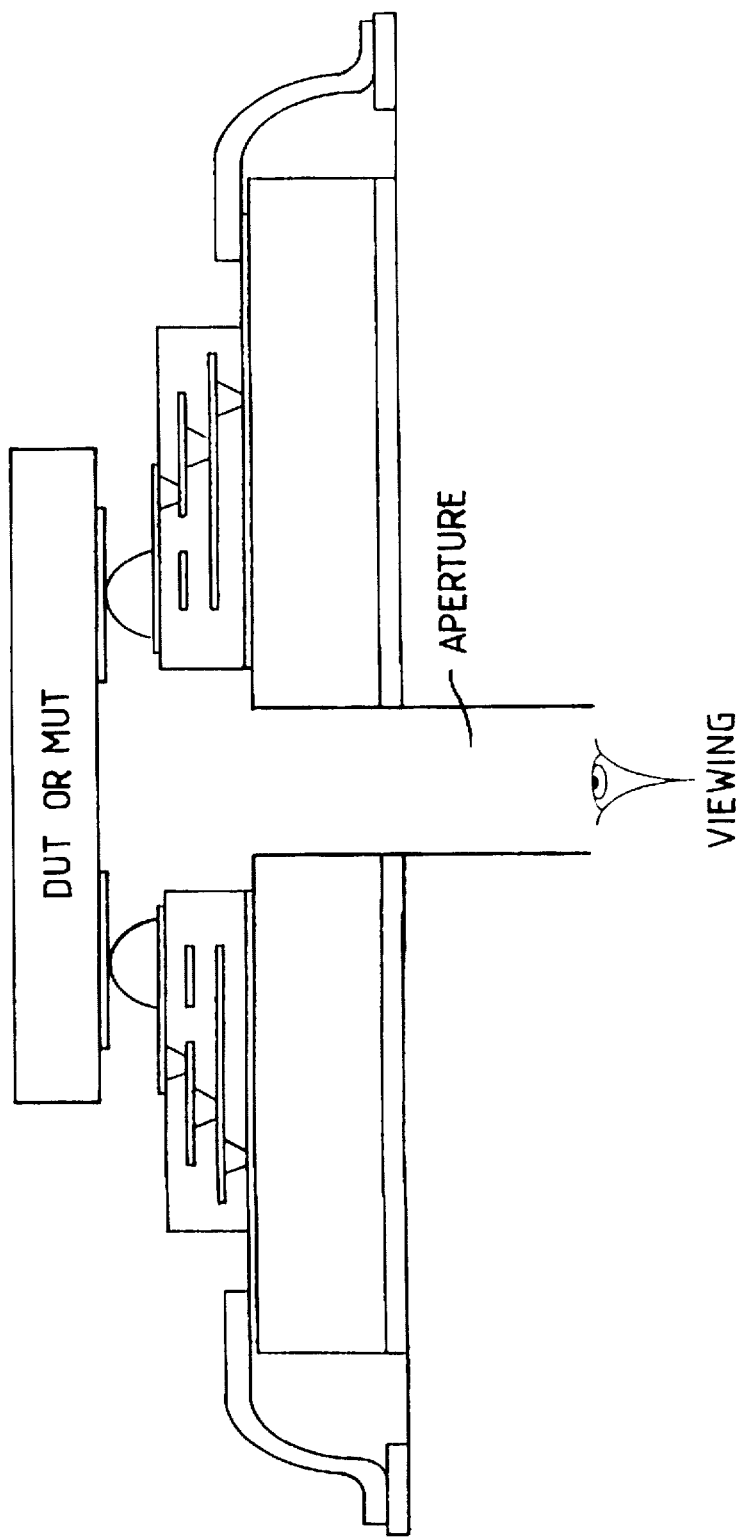

Referring now to FIG. 3 a suitably sized and shaped aperture 9 may be provided in the central region of the test head 8, defined for example by laser cutting in the case of a silicon or alumina substrate material, to completely remove the substrate locally and allow a multichip module substrate (not shown) to be presented to the test head without the mounted devices on the multichip module fouling and contacting the test head. The border region, even on a densely packed flip chip solder bonded multichip module, between the mounted devices and substrate edge is typically 1 mm, allowing sufficient room for the test head to clear the substrate edge and present the microbumps 2 to the pads on the module under test. The aperture 9 in the test head may be an irregular shape to allow contacts to be made within the area of a part populated multichip module if required. This could allow incremental testing of modules to be undertaken for example, prior to adding some very costly device or committing to a module package and the final assembly and packaging operations. The use of such apertures also simplifies the optical alignment of test head and device, wafer or module under test. Apertures 9 may be of simple, rectangular shapes or of more complex shapes. Castellated apertures, for example, will aid alignment to the corners of the device or module under test.

Figure 6:
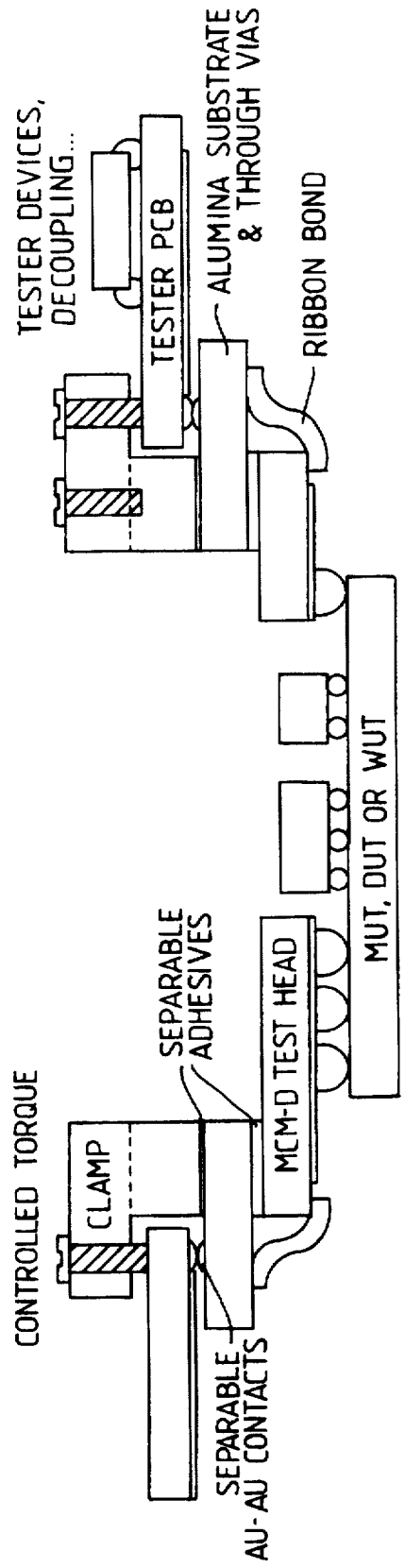

Referring now to FIG. 6, if the small size and associated low cost benefits of the present form of test head is to be realised, then a separable test head format is required so that an individual test head 12 may be replaced without having to replace the entire test apparatus. This also means that one test apparatus may be used to test a wide range of devices within the limits of the test head size employed (e.g. 12 or 20 mm).

FIG. 6 shows a separable test head 12 to which a device, wafer or module 13 under test may be presented. Ribbon bond connections 14 are made between the test head substrate 15 and an alumina substrate 16 that has been provided with through via connections (not shown). Such vias may be provided by conventional laser drilling and thick film or thin film metallization and via plating techniques, or by the use of solid plug vias defined by laser drilling, tungsten via filling and sintering and copper-tungsten liquid phase infiltration. Low contact resistance gold contacts 17 are provided on the rear face of this alumina substrate 16. These contacts 17 mate with corresponding contacts on the tester circuit board 18 to which the test head and its alumina substrate 16 is clamped. The test head substrate 15, the alumina substrate 16 and the mechanical clamp 19 that provides the necessary contact pressure are held together by means of thermoplastic adhesive layers 20 that may be heated to allow later separation of the assembly and rest head replacement. The selection of the thermoplastic material will determine the upper temperature limit for the use of such a separable test head arrangement.

In the arrangement described in U.K. Patent Application No. 9202560.0 the microbumps comprised copper spheres soldered onto metallization areas on the test head substrate. An alternative microbump structure 2 may comprise an electroless nickel plated structure, provided with a thin gold surface layer for low contact resistance. Such microbump structures 2 may be defined by first activating the surface of an aluminum metallization pad in the surface of the substrate located where the microbump is required. This is achieved by multiple immersion in a zincate solution at a controlled temperature. This multiple immersion treatment produces a uniform, fine grained zinc surface layer. The zinc layer then provides a suitable surface onto which an electroless nickel bump structure may be grown from a suitable electroless nickel plating solution at slightly elevated temperature 80°–90°C. typical). Phosphorus-containing electroless nickel solutions may be employed for greater layer hardness. The electroless nickel layer grows isotropically onto the pad and from the pad edges onto the surrounding passivation. If the nickel layer thickness is allowed to increase to the point where it is comparable to the pad diameter, an hemispherical nickel bump 2 is produced that forms an ideal microbump shape. An exchange gold plating solution is then employed to provide a thin gold layer on the surface of the bump 2 for low contact resistance. The electroless plating process provides sufficient inherent uniformity of microbump height to ensure uniform contact. Minor height nonuniformities will be absorbed by the compliance of the dielectric layers in the test head substrate.

Bump heights and diameters of about 30 micrometres may be employed to provide a small radius of contact to the device under test, of the order of 10 micrometres, thus allow the testing of devices with small bond pads, of the order of 50 micrometres diameter.

I claim:

1. A die testing apparatus, comprising: a multilayer metallization and dielectric structure formed on a rigid substrate of electrically insulating material and forming a testing station, said structure including an upper metallization layer, a ground plane metallization layer adjacent said substrate, at least one intermediate metallization layer, and a plurality of interlayer vias interconnecting at least parts of said metallization layers, and providing at least one controlled impedance interconnection adjacent said testing station, said testing station having a plurality of microbumps of conductive material located on interconnection trace terminations of said upper metallization layer and distributed in a pattern corresponding to a pattern of contact pads in respect of a die to be tested, a plurality of connections to and from said multilayer structure, said connections being of lower profile than said microbumps, and said multilayer structure being formed with at least one aperture to facilitate alignment to the die under test and to permit testing of the die on a module that is at least partly populated with active devices.

2. The die testing apparatus of claim 1, wherein said substrate has a periphery, and wherein said connections are located at said periphery.

3. The die testing apparatus of claim 1, wherein said connections include ribbon bonds.

4. The die testing apparatus of claim 3, wherein said ribbon bonds are in a range from 10–15 micrometers in thickness.

5. The die testing apparatus of claim 1, wherein said microbumps are hemispherical in shape.

6. The die testing apparatus of claim 1, wherein said multilayer structure has a thickness of about 20 micrometers, and wherein each of said microbumps has a thickness of about 30 micrometers.

7. The die testing apparatus of claim 1, wherein said at least one aperture is provided in a central region of said multilayer structure.

8. The die testing apparatus of claim 1; and further comprising a generally planar support on which said substrate is mounted, and wherein each of said microbumps has outer surface contacts at a first elevation relative to said support, and wherein each of said connections includes a ribbon bond extending between the support and the substrate and connected to the substrate at a second elevation relative to said support, said second elevation being less than said first elevation.

9. The die testing apparatus of claim 8, wherein said support is a printed circuit board.

* * * * *